United States Patent
Ebina et al.

(10) Patent No.: US 10,359,268 B2
(45) Date of Patent: Jul. 23, 2019

(54) STROKE SENSOR AND SADDLE RIDING TYPE VEHICLE

(71) Applicants: NIPPON SEIKI CO., LTD., Nagaoka-shi, Niigata (JP); HONDA MOTOR CO., LTD., Tokyo (JP)

(72) Inventors: Kota Ebina, Nagaoka (JP); Jun Morimoto, Tokyo (JP); Norifumi Shimizu, Fujimi (JP)

(73) Assignees: NIPPON SEIKI CO., LTD., Nagaoka-Shi (JP); HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/632,529

(22) Filed: Jun. 26, 2017

(65) Prior Publication Data
US 2018/0003478 A1 Jan. 4, 2018

(30) Foreign Application Priority Data
Jun. 30, 2016 (JP) .................. 2016-130888

(51) Int. Cl.
| | |
|---|---|
| G01B 7/00 | (2006.01) |
| G01B 7/14 | (2006.01) |
| G01D 5/14 | (2006.01) |
| G01V 3/08 | (2006.01) |
| B62K 11/00 | (2006.01) |
| G01D 11/24 | (2006.01) |

(Continued)

(52) U.S. Cl.
CPC ............... *G01B 7/14* (2013.01); *F16H 61/36* (2013.01); *G01B 7/003* (2013.01); *G01B 7/30* (2013.01); *G01D 5/147* (2013.01); *G01D 11/245* (2013.01); *G01R 33/09* (2013.01); *G01V 3/08* (2013.01); *B62K 11/00* (2013.01); *G01D 11/30* (2013.01)

(58) Field of Classification Search
CPC ...... G01D 5/145; F15B 15/28; F15B 15/2807
See application file for complete search history.

(56) References Cited

U.S. PATENT DOCUMENTS

| | | | | |
|---|---|---|---|---|
| 6,374,691 | B1 * | 4/2002 | Grundberg | B63H 21/213 440/86 |
| 7,280,937 | B1 * | 10/2007 | Greer | C23C 8/80 324/207.11 |
| 2009/0249914 | A1 * | 10/2009 | Kashiwai | F16H 63/30 74/473.21 |

FOREIGN PATENT DOCUMENTS

| | | |
|---|---|---|
| CN | 1397784 | 2/2003 |
| CN | 1467384 | 1/2004 |

(Continued)

OTHER PUBLICATIONS

European Search Report dated Oct. 2, 2017, 6 pages.

*Primary Examiner* — Noam Reisner
(74) *Attorney, Agent, or Firm* — Rankin, Hill & Clark LLP

(57) ABSTRACT

A stroke sensor includes: a shaft that extends in an axial line direction; a detected body that is fixed to the shaft; a housing that extends along the shaft, that houses the shaft, and that supports the shaft slidably in the axial line direction; and a detection body that detects a movement amount of the detected body which moves in accordance with sliding of the shaft, wherein the shaft includes a plurality of shaft members that are connected to each other in the axial line direction and that are formed of metal, and a slide part that is in contact with an inner wall of the housing and that slides so as to regulate a movement of the shaft in a direction that is crossed with the axial line is provided on each of the plurality of shaft members.

8 Claims, 11 Drawing Sheets

(51) Int. Cl.
*G01D 11/30* (2006.01)
*G01R 33/09* (2006.01)
*G01B 7/30* (2006.01)
*F16H 61/36* (2006.01)

(56) References Cited

FOREIGN PATENT DOCUMENTS

| | | |
|---|---|---|
| CN | 107559414 | 1/2018 |
| DE | 10 2012 111 908 | 6/2014 |
| DE | 10 2013 214 104 | 1/2015 |
| EP | 1 445 494 | 8/2004 |
| JP | 2014-130035 | 7/2014 |

* cited by examiner

STROKE SENSOR AND SADDLE RIDING TYPE VEHICLE

CROSS-REFERENCE TO RELATED APPLICATION

Priority is claimed on Japanese Patent Application No. 2016-130888, filed on Jun. 30, 2016, the contents of which are incorporated herein by reference.

BACKGROUND

Field of the Invention

The present invention relates to a stroke sensor and a saddle riding type vehicle.

Background

In the related art, for example, a stroke sensor is disclosed in Japanese Unexamined Patent Application, First Publication No. 2014-130035. The stroke sensor includes an iron shaft, a plastic holder that is connected to the shaft, a magnet that is fixed to the holder, a case body that supports the shaft, and a magnetic detection element that detects the magnetic field of the magnet.

SUMMARY

However, when the holder is made of plastic, it is necessary to integrally mold the holder, the shaft, and the magnet by outsert molding or insert molding, and therefore, it may be impossible to obtain high size accuracy. Further, accumulation of size errors associated with the increase of components and axial displacement of the shaft may occur. Further, when the stroke sensor is applied to a position where a great temperature change occurs, the holder may be thermally deformed. Therefore, it may be impossible to maintain high detection accuracy.

An object of an aspect of the present invention is to maintain high detection accuracy in a stroke sensor and a saddle riding type vehicle in which the movement amount of a detected body that moves in accordance with the sliding of a shaft is detected.

(1) A stroke sensor according to an aspect of the present invention includes: a shaft that extends in a direction along an axial line; a detected body that is fixed to the shaft; a housing that extends along the shaft, that houses the shaft, and that supports the shaft slidably in the direction along the axial line; and a detection body that detects a movement amount of the detected body which moves in accordance with sliding of the shaft, wherein the shaft includes a plurality of shaft members that are connected to each other in the direction along the axial line and that are formed of metal, and a slide part that is in contact with an inner wall of the housing and that slides so as to regulate a movement of the shaft in a direction that is crossed with the axial line is provided on each of the plurality of shaft members.

(2) In the above stroke sensor, the shaft may include a detected body-holding part that houses and holds the detected body, and a plurality of the slide parts may include a holding part-side slide part that is provided on the detected body-holding part.

(3) In the above stroke sensor, the plurality of the slide parts may further include a non-holding part-side slide part that is provided at a position which avoids the detected body-holding part, and an outer shape of the holding part-side slide part may be smaller than an outer shape of the non-holding part-side slide part when seen from the direction along the axial line.

(4) In the above stroke sensor, a groove part that is recessed more inward in a radial direction than the inner wall of the housing may be provided on the shaft.

(5) In the above stroke sensor, a lubricant may be arranged on the groove part.

(6) In the above stroke sensor, a portion of an outer circumferential surface of the slide part may form a shape having a flat surface, and the inner wall of the housing may have a shape that corresponds to the outer circumferential surface of the slide part.

(7) In the above stroke sensor, the plurality of the slide parts may include a large slide part having a relatively large outer shape when seen from the direction along the axial line, and the flat surface may be formed on the large slide part.

(8) In the above stroke sensor, the housing may include a first housing half body and a second housing half body that are divided in the direction along the axial line, the plurality of the slide parts may include a first slide part that is in contact with an inner wall of the first housing half body and a second slide part that is in contact with an inner wall of the second housing half body, the inner wall of the first housing half body and the inner wall of the second housing half body may have a shape that is different from each other when seen from the direction along the axial line, and the first slide part and the second slide part may have a shape that is different from each other when seen from the direction along the axial line.

(9) A saddle riding type vehicle according to another aspect of the present invention includes the above stroke sensor.

According to the above configuration (1), the shaft includes the plurality of shaft members that are connected to each other in the direction along the axial line and that are formed of metal, and thereby, it is possible to enhance the size accuracy of the shaft compared to a case in which the shaft member is formed of plastic. Further, the shaft members that are formed of metal are connected to each other, and therefore, it is possible to prevent accumulation of size errors associated with the increase of components and prevent axial displacement of the shaft. Further, even when the stroke sensor is applied to a position where a great temperature change occurs, the shaft is not thermally deformed. Further, the slide part that is in contact with the inner wall of the housing and that slides so as to regulate the movement of the shaft in the direction that is crossed with the axial line is provided on each of the plurality of shaft members. Thereby, it is possible to prevent the shaft from moving in the direction that is crossed with the axial line when the shaft slides. Accordingly, it is possible to maintain high detection accuracy. Additionally, although it is necessary to integrally mold the shaft member and the detected body by outsert molding or insert molding when the shaft member is formed of plastic, it is unnecessary to integrally mold the shaft member and the detected body by outsert molding or insert molding according to the above configuration (1). Therefore, it is possible to easily perform attachment between the shaft and the detected body.

According to the above configuration (2), the shaft includes the detected body-holding part that houses and holds the detected body, and the plurality of the slide parts includes the holding part-side slide part that is provided on the detected body-holding part. Thereby, position displacement between the detected body and the detection body does not easily occur, and therefore, it is possible to further reliably maintain high detection accuracy.

According to the above configuration (3), the plurality of the slide parts further includes the non-holding part-side slide part that is provided at a position which avoids the detected body-holding part, and the outer shape of the holding part-side slide part is smaller than the outer shape of the non-holding part-side slide part when seen from the direction along the axial line. Thereby, it is possible to ensure a larger arrangement space of the detection body compared to a case in which the outer shape of the holding part-side slide part is larger than the outer shape of the non-holding part-side slide part when seen from the direction along the axial line, and therefore, it is possible to prevent the size of the stroke sensor on the detection body side from being increased in a radial direction.

According to the above configuration (4), the groove part that is recessed more inward in a radial direction than the inner wall of the housing is provided on the shaft. Thereby, it is possible to reduce the contact area between the inner wall of the housing and the shaft, and therefore, it is possible to reduce a slide resistance.

According to the above configuration (5), the lubricant is arranged on the groove part. Thereby, it is possible to stop the lubricant by using the groove part, and therefore, it is possible to maintain a lubricating property.

According to the above configuration (6), a portion of the outer circumferential surface of the slide part forms a shape having a flat surface, and the inner wall of the housing has a shape that corresponds to the outer circumferential surface of the slide part. Thereby, it is possible to regulate the movement in the circumferential direction of the shaft with respect to the inner wall of the housing, and therefore, it is possible to stop rotation of the shaft around the axial line.

According to the above configuration (7), the plurality of the slide parts includes the large slide part having a relatively large outer shape when seen from the direction along the axial line, and the flat surface is formed on the large slide part. Thereby, the flat surface can be large. Therefore, it is possible to ensure the strength of a part that functions as a rotation stopper of the shaft and further reliably stop rotation of the shaft.

According to the above configuration (8), the housing includes the first housing half body and the second housing half body that are divided in the direction along the axial line, the plurality of the slide parts includes the first slide part that is in contact with the inner wall of the first housing half body and the second slide part that is in contact with the inner wall of the second housing half body, the inner wall of the first housing half body and the inner wall of the second housing half body have a shape that is different from each other when seen from the direction along the axial line, and the first slide part and the second slide part have a shape that is different from each other when seen from the direction along the axial line. Thereby, even when the combination between the first housing half body and the shaft and the combination between the second housing half body and the shaft are erroneous, the first housing half body and the shaft are not attached to each other, and the second housing half body and the shaft are not attached to each other. Therefore, it is possible to prevent erroneous attachment.

According to the above configuration (9), it is possible to maintain high detection accuracy in the saddle riding type vehicle that includes the above stroke sensor.

DESCRIPTION OF THE EMBODIMENTS

Figure 1:
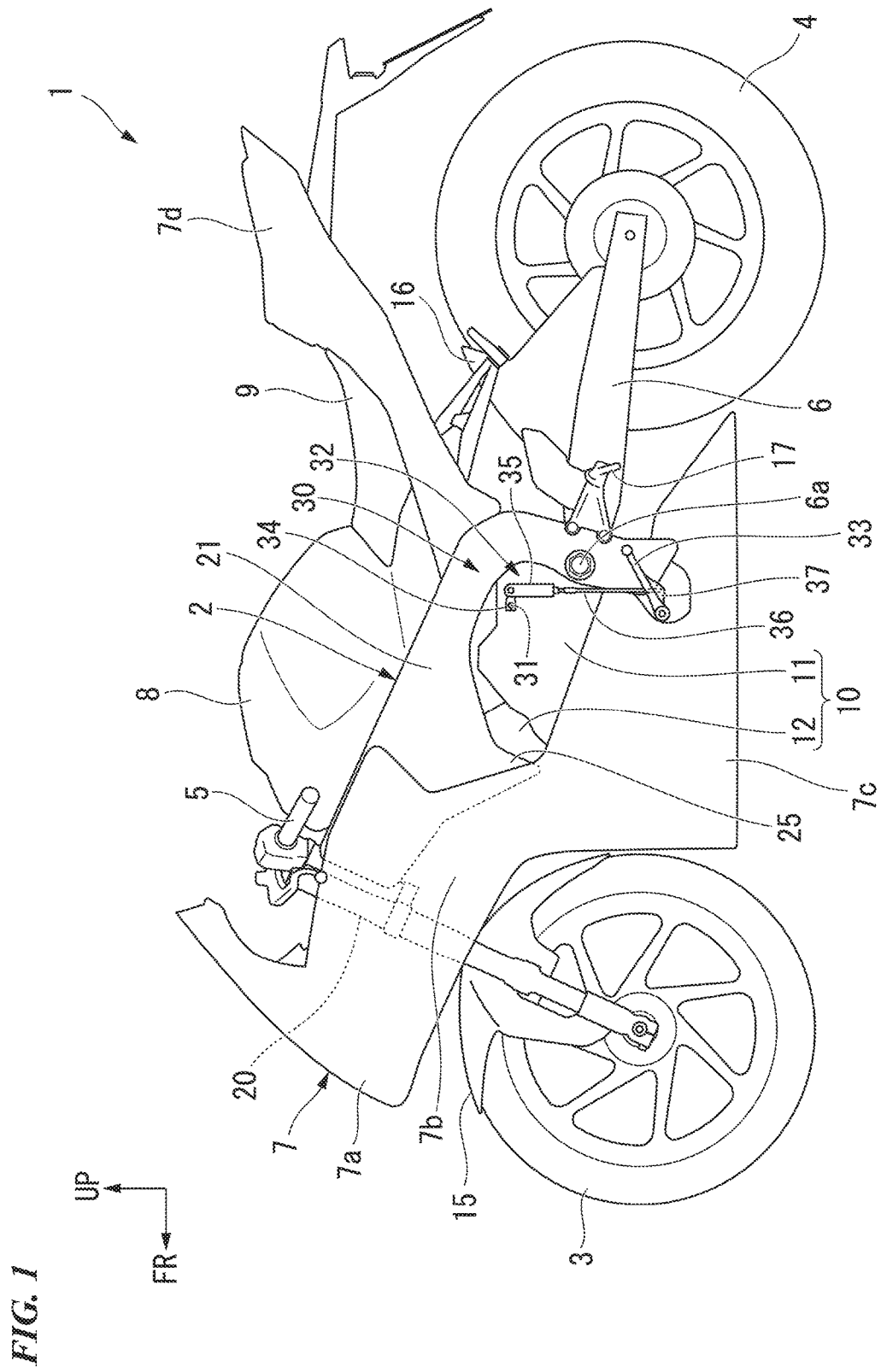
FIG. 1 is a left side view of a motorcycle according to an embodiment.

Hereinafter, an embodiment of the present invention will be described with reference to the drawings. Note that, front, rear, right, and left directions and the like in the following description are the same as front, rear, right, and left directions and the like of a vehicle described below if there is no particular description. In addition, in the drawings referred to in the following description, an arrow FR which indicates the front of the vehicle, an arrow LH which indicates the left of the vehicle, and an arrow UP which indicates the upside of the vehicle are shown.

<Entire Vehicle>

FIG. 1 shows a motorcycle 1 as an example of a saddle riding type vehicle. With reference to FIG. 1, the motorcycle 1 includes: a front wheel 3 that is steered using a handle 5; and a rear wheel 4 that is driven by a power unit 10 including an engine. Hereinafter, the motorcycle may be simply referred to as a "vehicle".

A steering system component including the handle 5 and the front wheel 3 is steerably and pivotally supported by a head pipe 20 that is formed on a front end part of a vehicle body frame 2. A handle steering shaft (not shown) that is connected to the handle 5 is inserted through the head pipe 20. The power unit 10 is arranged at a middle part in a front-to-rear direction of the vehicle body frame 2. A swing arm 6 is pivotally supported swingably upward and downward around a pivot shaft 6a on a rear part of the power unit 10. A rear suspension (not shown) is provided between a front part of the swing arm 6 and a rear part of the vehicle body frame 2.

For example, the vehicle body frame 2 is formed of a variety of steel materials that are integrally joined by welding or the like. The vehicle body frame 2 includes: a pair of right and left main frames 21 that extend rearward and downward from the head pipe 20 and that are then bent downward to extend; a cross member (not shown) that extends in a vehicle width direction so as to connect the right and left main frames 21; and a seat rail (not shown) that extends rearward and upward from a rear upper end part of each of the right and left main frames 21. An engine hanger 25 that extends rearward and downward is provided on a front lower end part of each of the right and left main frames 21.

The power unit 10 is attached to the engine hanger 25 and a rear lower part of each of the right and left main frames 21. The power unit 10 includes: a crankcase 11; and a cylinder part 12 that protrudes frontward and upward from an upper part of the crankcase 11 in side view.

A fuel tank 8 is arranged above the right and left main frames 21. A seat 9 is arranged on the seat rail (not shown) and at a rear position of the fuel tank 8.

The vehicle body frame 2 is covered by a vehicle body cover 7. The vehicle body cover 7 includes: a front cowl 7a that covers a front part of the vehicle body frame 2; a front side cowl 7b that covers a front side part of the vehicle body frame 2; an under cowl 7c that covers a lower part of the vehicle body frame 2; and a rear cowl 7d that covers a rear part of the vehicle body frame 2.

A transmission device 30 is provided integrally on a rear part of the engine. The transmission device 30 includes: a shift spindle 31 that protrudes leftward from a left side surface of the crankcase 11; a shift link mechanism 32 that is attached to a front end part of the shift spindle 31; and a shift pedal 33 that is connected to the shift link mechanism 32 as a shift speed change means.

The shift link mechanism 32 includes: a shift arm 34 that is attached to a front end part of the shift spindle 31; a stroke sensor 35 having an upper end part that is connected rotatably to the shift arm 34 via a connection pin; a link 36 having an upper end part that is connected to a lower end part of the stroke sensor 35; a middle arm 37 that is attached rotatably to a support shaft (not shown) which is provided on the crankcase 11; and a control unit (ECU; Engine Control Unit) (not shown). One end part of the middle arm 37 is connected rotatably to a lower end part of the link 36 via a connection pin. The other end part of the middle arm 37 is connected rotatably to the shift pedal 33 via a connection pin.

The ECU functions as a control unit that receives a stroke signal (detection value of a stroke amount) from the stroke sensor 35. The ECU calculates a load (shift operation load) that is generated when a biasing member 63 described below is pressed by the stroke amount based on the stroke signal.

In FIG. 1, reference numeral 15 indicates a front fender, reference numeral 16 indicates a rear fender, and reference numeral 17 indicates a main step.

<Stroke Sensor>

Figure 2:
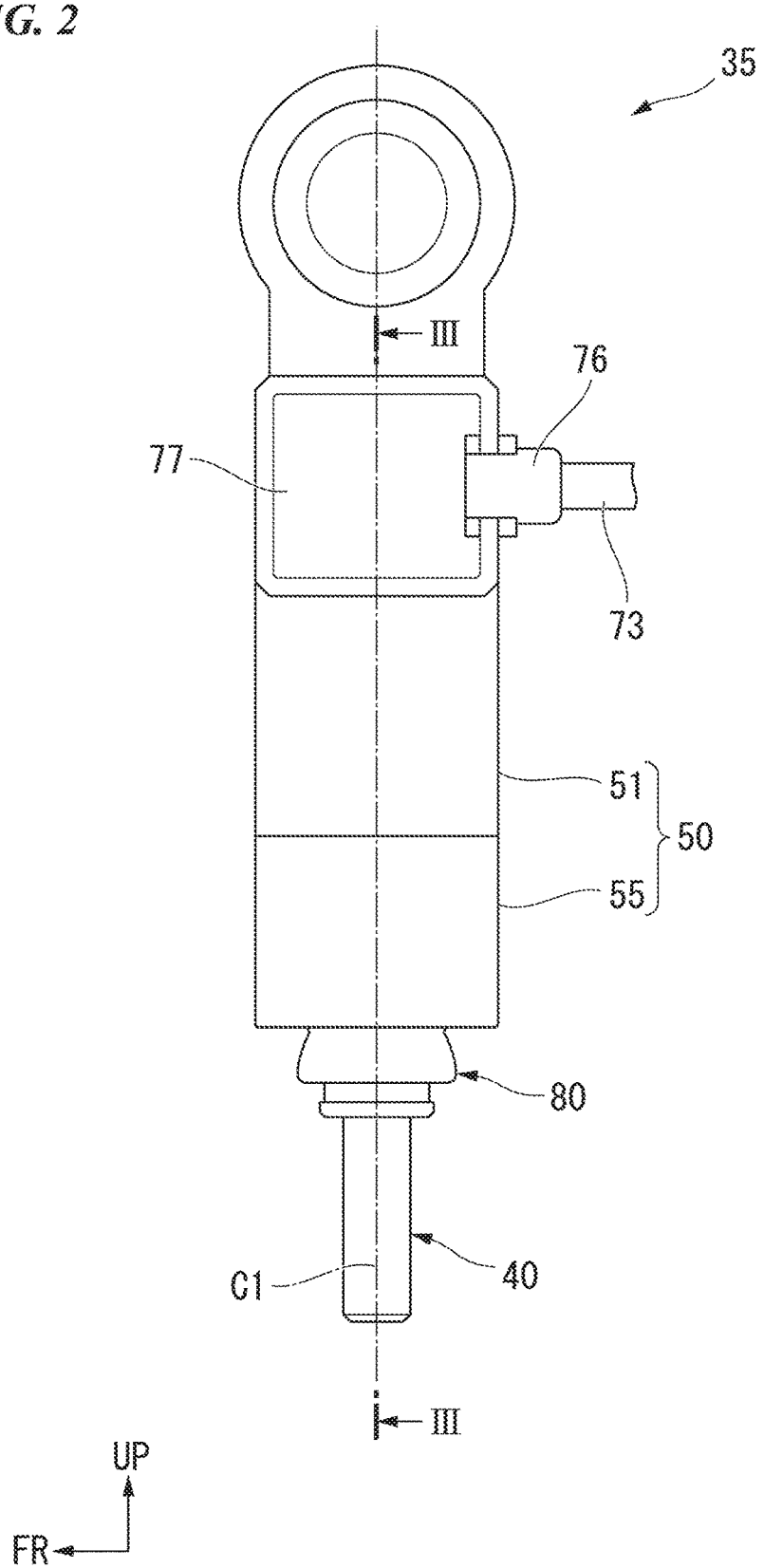
FIG. 2 is a left side view of a stroke sensor according to the embodiment.

As shown in FIG. 2, the stroke sensor 35 includes: a shaft 40 that extends in a direction along an axial line C1; a housing 50 that extends along the shaft 40, houses the shaft 40 in a state where the shaft 40 protrudes outside, and supports the shaft 40 slidably in the direction along the axial line C1; an origin return means 60 (refer to FIG. 3) that causes the shaft 40 to return to an origin position; a detection part 70 (refer to FIG. 3) that detects a slide amount of the shaft 40; and a cover 80 that covers a slide end 55a (refer to FIG. 3) on a protrusion side of the shaft 40 in a slide region between the shaft 40 and the housing 50 while allowing a relative movement between the shaft 40 and the housing 50.

For ease of understanding, the axial line C1 in the drawing is matched with a line that extends in a vertical direction. In the following description, the direction along the axial line C1 may be referred to as an "axial line direction", an inner side of the vertical direction in the axial line direction may be referred to as an "axial line direction inside", and an outer side of the vertical direction in the axial line direction may be referred to as an "axial line direction outside".

<Shaft>

Figure 3:
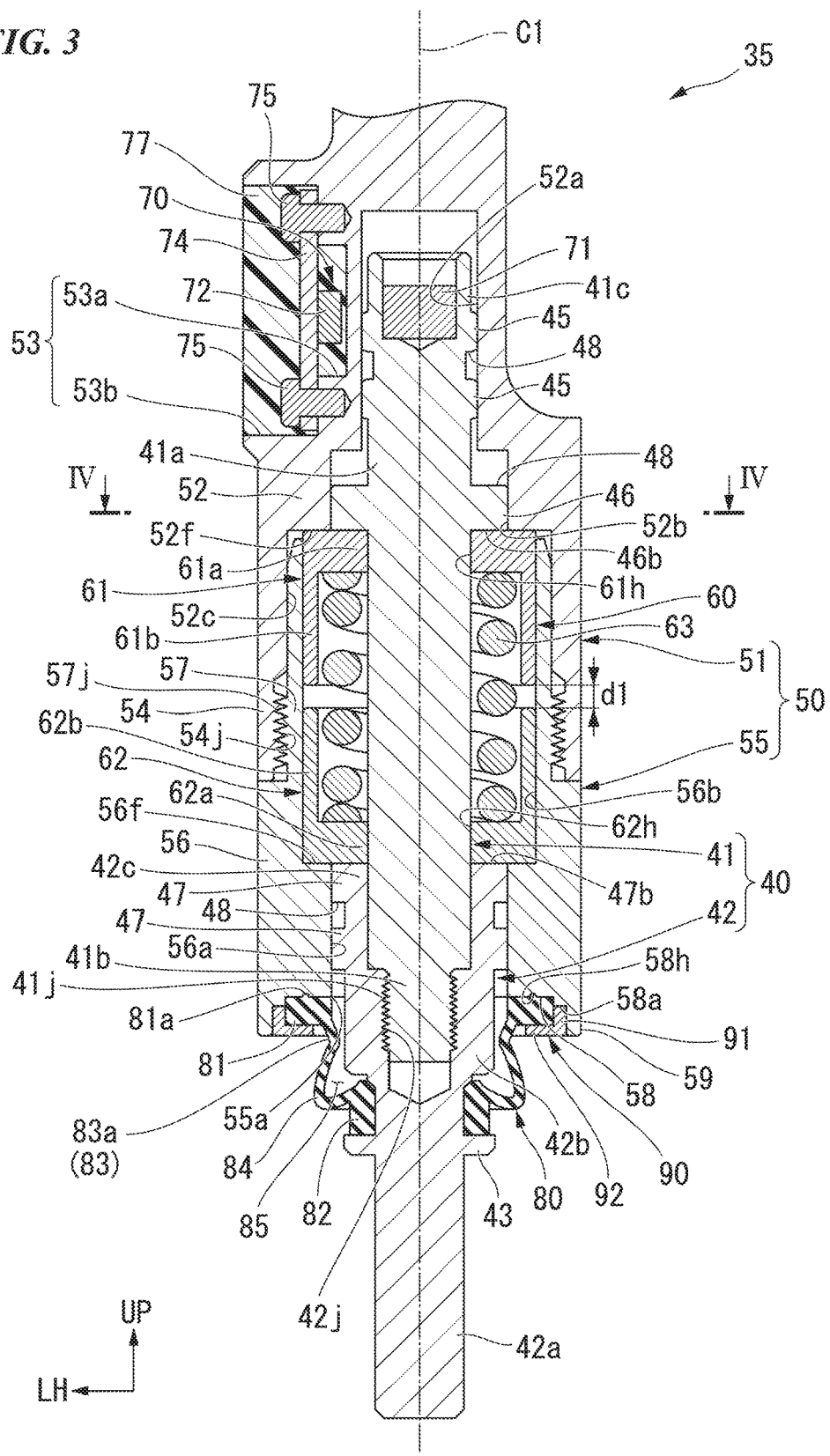
FIG. 3 is a cross-sectional view of FIG. 2.

As shown in FIG. 3, the shaft 40 includes a plurality of shaft members 41, 42 that are connected to each other in the axial line direction and that are formed of metal. The plurality of shaft members 41, 42 includes: a first shaft member 41 that is arranged at an upper position in the axial line direction; and a second shaft member 42 that is arranged at a lower position in the axial line direction. A slide part 45 that is in contact with an inner wall of the housing 50 and that slides so as to regulate the movement of the shaft 40 in a direction that is crossed with the axial line is provided on the first shaft member 41. A slide part 47 that is in contact with an inner wall of the housing 50 and that slides so as to regulate the movement of the shaft 40 in the direction that is crossed with the axial line is provided on the second shaft member 42.

<First Shaft Member>

The first shaft member 41 is formed of non-magnetic metal. For example, the first shaft member 41 is formed of an austenitic stainless steel (SUS; Steel Use Stainless).

The first shaft member 41 includes: a first shaft member main body 41a that extends in the axial line direction; a connection part 41b that protrudes downward from a lower end of the first shaft member main body 41a and that is connected to the second shaft member 42; a detected body-holding part 41c that is provided on an upper end part of the first shaft member main body 41a and that houses and holds a detected body 71; and an extended diameter part 46 that is close to an inner wall of the housing 50 while keeping a slight gap without coming into contact with the inner wall of the housing 50 (without sliding).

The first shaft member main body 41a has a column shape that extends linearly in the axial line direction. The outer circumferential surface of the first shaft member main body 41a is formed of a smooth surface.

The connection part 41b extends concentrically with the first shaft member main body 41a. The connection part 41b has a column shape having a smaller diameter than the first shaft member main body 41a. A male screw part 41j having a screw thread is formed on an outer circumferential surface of the connection part 41b.

The detected body-holding part 41c has a recess shape that is recessed inside in the axial line direction from an upper end of the first shaft member main body 41a. The detected body 71 is pressed in and is held by the detected body-holding part 41c. The detected body 71 is strongly fixed to the detected body-holding part 41c by a fixation means such as an adhesion bond.

Figure 4:
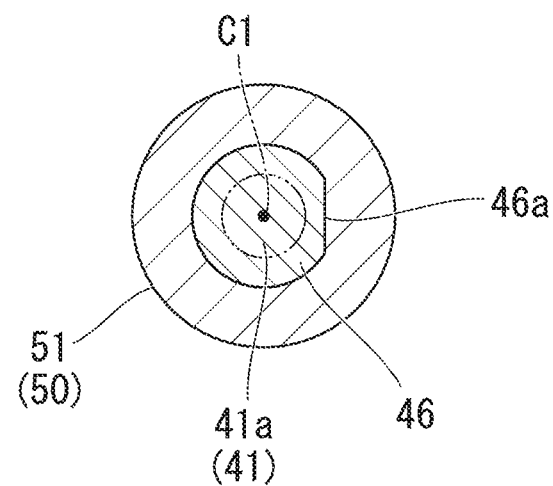
FIG. 4 is a view that corresponds to a IV-IV cross-section of FIG. 3.

As shown in FIG. 4, the extended diameter part 46 continues integrally to an outer circumferential surface of the first shaft member main body 41a. The extended diameter part 46 forms a D-shaped annular shape having an outer shape that is larger than the first shaft member main body 41a when seen from the axial line direction. A portion of the outer circumferential surface of the extended diameter part 46 forms a shape having a flat surface 46a. The inner wall of the housing 50 has a shape that corresponds to the outer circumferential surface of the extended diameter part 46. That is, the outline of the inner wall of the housing 50 is formed along the outline of the outer circumferential surface of the extended diameter part 46 when seen from the axial line direction.

<Second Shaft Member>

With reference back to FIG. 3, the second shaft member 42 is formed of non-magnetic metal. Similarly to the first shaft member 41, the second shaft member 42 can be preferably formed of non-magnetic metal but may be formed of a soft magnetic material such as a steel material. A distance to the detection part 70 (magnet, magnetic detection element, and the like) is ensured, and therefore, the impact degree on the magnetic field is low even when the second shaft member 42 is formed of a soft magnetic material such as a steel material. It is possible to arbitrarily select a material of the second shaft member 42 in consideration of costs or strength.

The second shaft member 42 includes: a second shaft member main body 42*a* that extends in the axial line direction; a connected part 42*b* that is provided on an upper end part of the second shaft member main body 42*a* and that is connected to the first shaft member 41; and a guide part 42*c* that guides a lower end part of the first shaft member main body 41*a*. A rib 43 that protrudes outward in a radial direction so as to be in close contact with the cover 80 is provided on the second shaft member 42.

The second shaft member main body 42*a* has a column shape that extends linearly concentrically with the first shaft member main body 41*a*. The second shaft member main body 42*a* protrudes downward from the housing 50 and is exposed outside.

The connected part 42*b* extends concentrically with the second shaft member main body 42*a*. The connected part 42*b* has a cylindrical shape having a larger diameter than the second shaft member main body 42*a*. A female screw part 42*j* having a screw thread is formed on an inner circumferential surface of the connected part 42*b*. The male screw part 41*j* of the first shaft member 41 is connected to the female screw part 42*j* of the second shaft member 42 by screwing. For example, a reinforcement adhesion bond such as a seal lock agent is filled in a space between the connection part 41*b* and the connected part 42*b* from the viewpoint of preventing the screw from being loosened.

The guide part 42*c* has a cylindrical shape that continues to an upper end of the connected part 42*b*. The guide part 42*c* has substantially the same outer shape as the connected part 42*b* when seen from the axial line direction. The guide part 42*c* has a larger inner shape than the connected part 42*b* when seen from the axial line direction. The inner shape of the guide part 42*c* has a size that corresponds to the outer shape of the first shaft member main body 41*a* when seen from the axial line direction such that the first shaft member main body 41*a* can be guided. The inner circumferential surface of the guide part 42*c* is formed of a smooth surface.
<Slide Part>

A plurality of slide parts 45, 47 includes: a plurality of (for example, two in the present embodiment) holding part-side slide parts 45 that are provided on the detected body-holding part 41*c*; and a plurality of (for example, two in the present embodiment) non-holding part-side slide parts 47 that are provided at a position which avoids the detected body-holding part 41*c*. The two non-holding part-side slide parts 47 are provided on the second shaft member 42.

The holding part-side slide part 45 continues integrally to an outer circumferential surface of the detected body-holding part 41*c*. The holding part-side slide part 45 forms an annular shape having a larger outer shape than the detected body-holding part 41*c* when seen from the axial line direction.

The non-holding part-side slide part 47 continues integrally to an outer circumferential surface of the guide part 42*c* of the second shaft member 42. The non-holding part-side slide part 47 forms a D-shaped annular shape having a larger outer shape than the guide part 42*c* when seen from the axial line direction.

The outer shape of the extended diameter part 46 and the outer shape of the non-holding part-side slide part 47 have substantially the same size when seen from the axial line direction. The outer shape of the holding part-side slide part 45 is smaller than the outer shape of the non-holding part-side slide part 47 when seen from the axial line direction.

Figure 5:
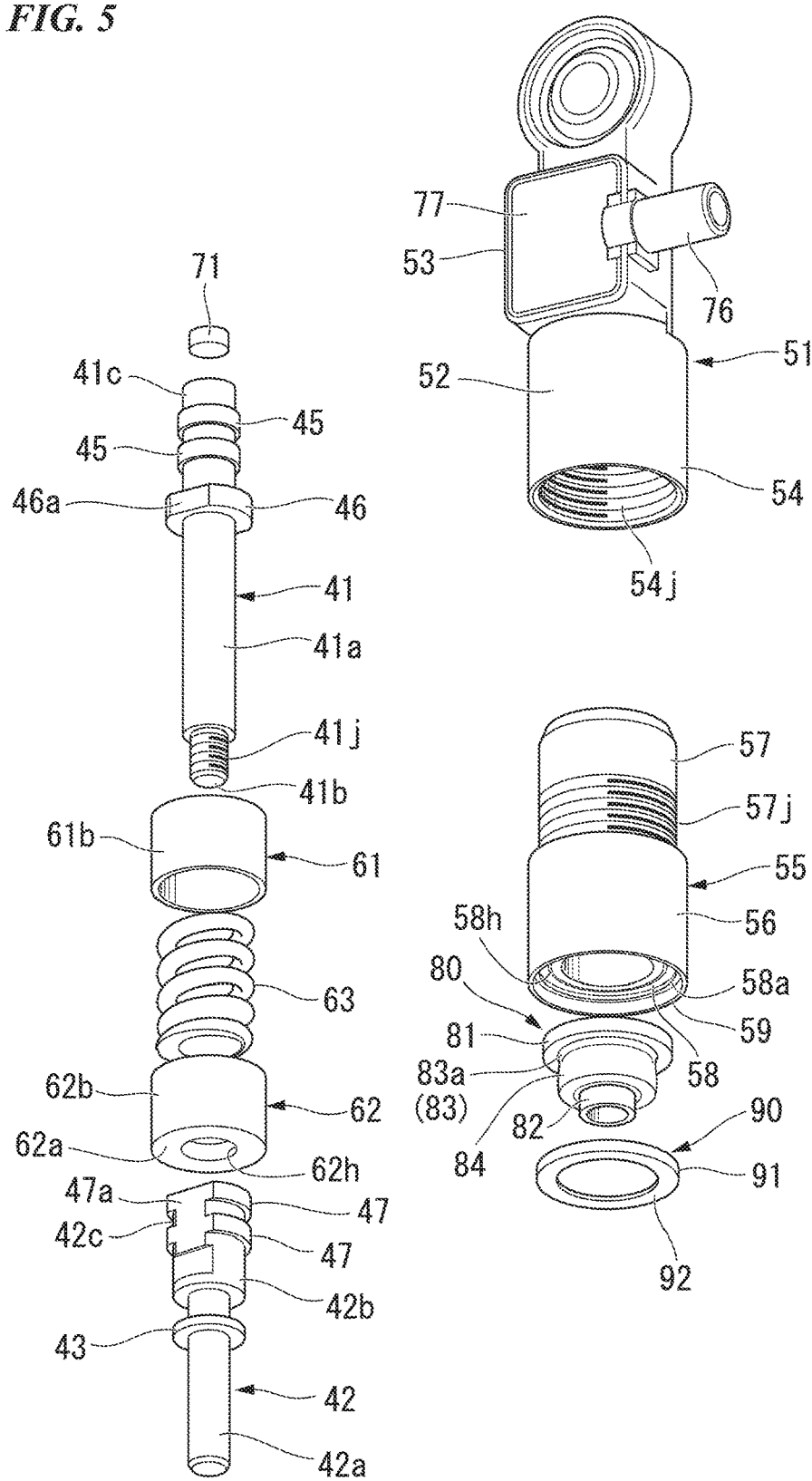
FIG. 5 is an exploded perspective view of the stroke sensor according to the embodiment.

As shown in FIG. 5, a portion of the outer circumferential surface of the non-holding part-side slide part 47 forms a shape having a flat surface 47*a*. That is, the flat surface 47*a* is formed on the non-holding part-side slide part 47.

The non-holding part-side slide part 47 has a relatively large outer shape when seen from the axial line direction. The non-holding part-side slide part 47 may be referred to as a "large slide part".

As shown in FIG. 3, a groove part 48 that is recessed more inward in the radial direction than the inner wall of the housing 50 is provided on the shaft 40. In the first shaft member 41, the groove part 48 is formed between the two holding part-side slide parts 45 that are adjacent to each other in the axial line direction and between the holding part-side slide part 45 and the extended diameter part 46 that are adjacent to each other in the axial line direction. In the second shaft member 42, the groove part 48 is formed between the two non-holding part-side slide parts 47 that are adjacent to each other in the axial line direction. A lubricant (not shown) is arranged on the groove part 48.
<Housing>

The housing 50 includes a first housing half body 51 and a second housing half body 55 that are divided in the axial line direction.
<First Housing Half Body>

The first housing half body 51 is formed of a non-magnetic material. For example, the first housing half body 51 is formed of a metal material such as aluminum and a stainless steel or a plastic material such as polybutylene terephthalate (PBT). The first housing half body 51 includes: a first housing half body main body 52 that extends in the axial line direction; a detection body housing part 53 that is provided on an upper side part of the first housing half body main body 52 and that houses a detection body 72; and a connected part 54 that is provided on a lower end part of the first housing half body main body 52 and that is connected to the second housing half body 55.

The first housing half body main body 52 has a tube shape that slidably houses the first shaft member 41. The first housing half body main body 52 includes: a holding part-side inner wall 52*a* that slidably holds the holding part-side slide part 45; a first non-holding part-side inner wall 52*b* that surrounds the extended diameter part 46 and that has a larger inner shape than the holding part-side inner wall 52*a* when seen from the axial line direction; and a guide inner wall 52*c* that guides the second housing half body 55 and that has a larger inner shape than the first non-holding part-side inner wall 52*b* when seen from the axial line direction. A first piston regulation surface 52*f* that regulates the movement in the axial line direction (upward) of a first piston 61 of the origin return means 60 is provided between the first non-holding part-side inner wall 52*b* and the guide inner wall 52*c*.

The detection body housing part 53 is arranged at a part that overlaps in the radial direction with a movement region in the axial line direction of the detected body 71. The detection body housing part 53 includes: a detection body housing recess part 53*a* that houses the detection body 72; and a substrate housing part 53*b* that has a larger inner shape than the detection body housing recess part 53*a*, opens outward in the radial direction, and is in communication with the detection body housing recess part 53a. A printed-wiring board 74 that is connected to an external apparatus (not shown) via a cable 73 (refer to FIG. 2) is housed in the substrate housing part 53b. The printed-wiring board 74 is fixed to the first housing half body 51 by a plurality of screws 75.

A grommet 76 (refer to FIG. 2) that protects the cable 73 is provided on a connection part with the printed-wiring board 74 in the cable 73. A filling member 77 such as a potting material is provided on the detection body housing part 53 and the substrate housing part 53b in order to make the detection body 72, the printed-wiring board 74, and the connection part between the printed-wiring board 74 and the cable 73 airtight.

The connected part 54 has a cylindrical shape that extends concentrically with the first housing half body main body 52. A female screw part 54j having a screw thread is formed on an inner circumferential surface of the connected part 54.

<Second Housing Half Body>

The second housing half body 55 is formed of a non-magnetic material. Similarly to the first housing half body 51, the second housing half body 55 can be preferably formed of non-magnetic metal but may be formed of a soft magnetic material such as a steel material. A distance to the detection part 70 (magnet, magnetic detection element, and the like) is ensured, and therefore, the impact degree on the magnetic field is low even when the second housing half body 55 is formed of a soft magnetic material such as a steel material. It is possible to arbitrarily select a material of the second housing half body 55 in consideration of costs or strength.

The second housing half body 55 includes: a second housing half body main body 56 that extends in the axial line direction; and a connection part 57 that is provided on an upper end part of the second housing half body main body 56 and that is connected to the first housing half body 51. A flange surface 58 that extends outward in the radial direction from the slide end 55a and a protrusion wall 59 that protrudes outward in the axial line direction (that is, downward) from an outer circumferential part of the flange surface 58 are provided on the second housing half body 55.

The second housing half body main body 56 has a tube shape that slidably houses the second shaft member 42. The second housing half body main body 56 includes: a second non-holding part-side inner wall 56a that slidably holds the non-holding part-side slide part 47; and an origin return means housing inner wall 56b that houses the origin return means 60 and that has a larger inner shape than the second non-holding part-side inner wall 56a when seen from the axial line direction. A second piston regulation surface 56f that regulates the movement in the axial line direction (downward) of a second piston 62 of the origin return means 60 is provided between the second non-holding part-side inner wall 56a and the origin return means housing inner wall 56b.

The connection part 57 has a cylindrical shape that extends concentrically with the second housing half body main body 56. A male screw part 57j having a screw thread is formed on an outer circumferential surface of the connection part 57. The male screw part 57j of the second housing half body main body 56 is connected to the female screw part 54j of the first housing half body 51 by screwing. For example, a reinforcement adhesion bond such as a seal lock agent is filled in a space between the connection part 57 and the connected part 54 from the viewpoint of preventing the screw from being loosened.

The holding part-side inner wall 52a of the first housing half body 51 and the second non-holding part-side inner wall 56a of the second housing half body 55 have a different shape from each other when seen from the axial line direction. The holding part-side slide part 45 and the non-holding part-side slide part 47 have a different shape from each other when seen from the axial line direction. The holding part-side slide part 45 may be referred to as a "first slide part". The non-holding part-side slide part 47 may be referred to as a "second slide part".

<Origin Return Means>

The origin return means 60 includes: a pair of the pistons 61, 62 that are aligned in the axial line direction; and the biasing member 63 that is provided between the pair of the pistons 61, 62 and that biases the pair of the pistons 61, 62 such that the pistons are separated from each other.

Each of the pair of the pistons 61, 62 is formed of a non-magnetic material. Each of the pair of the pistons 61, 62 can be preferably formed of non-magnetic metal but may be formed of a soft magnetic material such as a steel material. A distance to the detection part 70 (magnet, magnetic detection element, and the like) is ensured, and therefore, the impact degree on the magnetic field is low even when each of the pair of the pistons 61, 62 is formed of a soft magnetic material such as a steel material. It is possible to arbitrarily select a material of the pair of the pistons 61, 62 in consideration of durability or strength.

The pair of the pistons 61, 62 includes: the first piston 61 that is arranged at an upper position in the axial line direction; and the second piston 62 that is arranged at a lower position in the axial line direction.

The first piston 61 includes: a slide bottom wall 61a having an annular shape when seen from the axial line direction and which is slidably supported by the first shaft member main body 41a; and an outer circumferential wall 61b having a tube shape so as to surround the biasing member 63 and which protrudes downward from an outer circumferential part of the slide bottom wall 61a.

The second piston 62 includes: a slide bottom wall 62a having an annular shape when seen from the axial line direction and which is slidably supported by the first shaft member main body 41a; and an outer circumferential wall 62b having a tube shape so as to surround the biasing member 63 and which protrudes upward from an outer circumferential part of the slide bottom wall 62a. That is, the second piston 62 has a vertically inverted shape of the first piston 61. A penetration hole 61h that opens in the axial line direction is formed on the slide bottom wall 61a of the first piston 61. A penetration hole 62h that opens in the axial line direction is formed on the slide bottom wall 62a of the second piston 62.

The first piston 61 and the second piston 62 are arranged between the first piston regulation surface 52f and the second piston regulation surface 56f in the housing 50. The first piston 61 is arranged so as to have a clearance between the outer circumferential wall 61b of the first piston 61 and the origin return means housing inner wall 56b of the second housing half body 55. The second piston 62 is arranged so as to have a clearance between the outer circumferential wall 62b of the second piston 62 and the origin return means housing inner wall 56b of the second housing half body 55. Thereby, even when stress is applied to the shaft 40 by a large load being applied after being installed in a vehicle, the first piston 61 and the second piston 62 do not easily come into contact with the origin return means housing inner wall 56b, and therefore, it is possible to prevent a factor that affects an operation feeling such as the first piston 61, the second piston 62, the origin return means housing inner wall 56*b*, and the biasing member 63 being damaged.

For example, the biasing member 63 is a coil spring that is formed of non-magnetic metal such as a stainless steel and SUS304WPB. The biasing member 63 may be formed of a soft magnetic material (for example, a hard steel wire such as SWB and SWC). A distance to the detection part 70 (magnet, magnetic detection element, and the like) is ensured, and therefore, the impact degree on the magnetic field is low even when the biasing member 63 is formed of a soft magnetic material. It is possible to arbitrarily select a material of the biasing member 63 in consideration of durability or strength.

The biasing member 63 constantly biases the first piston 61 and the second piston 62 in the axial line direction such that the first piston 61 and the second piston 62 are separated from each other. That is, even when the shaft 40 is at any position, the biasing member 63 can press the first piston 61 to come into contact with the first piston regulation surface 52*f* and an end surface 46*b* of the extended diameter part 46 and can press the second piston 62 to come into contact with the second piston regulation surface 56*f* and an end surface 47*b* of the non-holding part-side slide part 47. Therefore, even when a clearance is provided between the outer circumferential wall 61*b* of the first piston 61 and the origin return means housing inner wall 56*b* of the second housing half body 55, and a clearance is provided between the outer circumferential wall 62*b* of the second piston 62 and the origin return means housing inner wall 56*b* of the second housing half body 55, it is possible to prevent the vibration of the first piston 61 and the second piston 62, and it is possible to obtain a constant operation feeling with respect to the stroke of the shaft 40. Additionally, the vibration of the first piston 61 and the second piston 62 is prevented, and thereby, it is possible to stabilize the detection accuracy by the detection body 72.

When the shaft 40 is at an origin position, the first piston 61 is in contact with the first piston regulation surface 52*f* and the end surface 46*b* of the extended diameter part 46, the second piston 62 is in contact with the second piston regulation surface 56*f* and the end surface 47*b* of the non-holding part-side slide part 47, and thereby, an inter-shaft distance is regulated. The term "inter-shaft distance" refers to a distance between the lower end of the outer circumferential wall 61*b* of the first piston 61 and the upper end of the outer circumferential wall 62*b* of the second piston 62. When the shaft 40 is at the origin position, the lower end of the outer circumferential wall 61*b* of the first piston 61 and the upper end of the outer circumferential wall 62*b* of the second piston 62 are separated in the axial line direction from each other, and therefore, the separated distance d1 is a stroke (detected stroke) of the shaft 40 that is detected by the detection body 72.

When the shaft 40 at the origin position is displaced so as to be pushed into the housing 50 (that is, so as to be pushed upward), in a state where the first piston 61 is in contact with the first piston regulation surface 52*f*, the second piston 62 comes into contact with and is supported by the end surface 47*b* of the non-holding part-side slide part 47 to be moved upward against the biasing force of the biasing member 63, and thereby, the second piston 62 is separated from the second piston regulation surface 56*f*. The shaft 40 is movable upward until the upper end of the outer circumferential wall 62*b* of the second piston 62 comes into contact with the lower end of the outer circumferential wall 61*b* of the first piston 61. When no force that presses the shaft 40 upward is applied, the shaft 40 returns to the origin position by the biasing force of the biasing member 63.

When the shaft 40 at the origin position is displaced so as to be drawn from the housing 50 (that is, so as to be drawn downward), in a state where the second piston 62 is in contact with the second piston regulation surface 56*f*, the first piston 61 comes into contact with and is supported by the end surface 46*b* of the extended diameter part 46 to be moved downward against the biasing force of the biasing member 63, and thereby, the first piston 61 is separated from the first piston regulation surface 52*f*. The shaft 40 is movable downward until the lower end of the outer circumferential wall 61*b* of the first piston 61 comes into contact with the upper end of the outer circumferential wall 62*b* of the second piston 62. When no force that draws the shaft 40 downward is applied, the shaft 40 returns to the origin position by the biasing force of the biasing member 63.

A lubricant such as grease is applied to the origin return means housing inner wall 56*b* that houses the first piston 61 and the second piston 62. Thereby, it is possible to stably ensure the sliding of the first piston 61 and the second piston 62 with respect to the shaft 40 in the long term.

<Detection Part>

The detection part 70 includes: the detected body 71 that is fixed to the shaft 40; and the detection body 72 that detects the movement amount of the detected body 71 which is moved in accordance with the sliding of the shaft 40.

<Detected Body>

For example, the detected body 71 is a SmCo sintered magnet having a circular column shape and two magnetized poles in the axial line direction. The detected body 71 is displaced together with the shaft 40 in the axial line direction, and thereby, the direction of a magnetic field (magnetic force) that is received by the detection body 72 is changed. Thereby, the movement amount of the detected body 71 is detected by the detection body 72.

The shape of the detected body 71 is not limited to a circular column shape. The detected body 71 may have a square column shape. The detected body 71 may be a rare-earth magnet such as a samarium-cobalt magnet and a neodymium magnet.

The detected body 71 is not limited to a sintered magnet. The detected body 71 may be a plastic magnet. The sintered magnet has a stronger magnetic force than the plastic magnet. On the other hand, the plastic magnet has a superior mass production property and a superior cracking-resistant property than the sintered magnet. Therefore, the magnet used for the detected body 71 may be arbitrarily selected in accordance with use conditions or design requirement.

<Detection Body>

The detection body 72 includes a plurality of magnetic detection elements. For example, the detection body 72 is formed as a magnetic detection package in which a plurality of Hall elements (magnetic detection elements) are mounted on a circuit board. The detection body 72 converts the change of a magnetic force in accordance with the displacement such as the movement of the detected body 71 into an electric signal and outputs the converted electric signal outside.

The magnetic detection surface of the detection body 72 is arranged in a direction that is orthogonal to the magnetization direction of the detected body 71.

The detection body 72 is provided on a surface on the detected body 71 side of the printed-wiring board 74. The detection body 72 is made to be airtight by the filling member 77 described above in a state where the detection body 72 is housed in the detection body housing part 53.

Thereby, the gap between the detection body 72 and the detected body 71 is made as small as possible, and it is possible to detect the change of the magnetic field with high accuracy. The airtightness may be maintained using packing or a lid member (not shown).

The detection body 72 detects, via the plurality of Hall elements, a magnetic field (a magnetic field in a vertical direction with respect to the magnetic detection surface and a magnetic field in two horizontal directions with respect to the magnetic detection surface) generated by the detected body 71. Angle calculation is performed on the obtained magnetic field in two directions using a trigonometric function (ATAN) in a processing circuit (for example, ASIC; Application Specific Integrated Circuit), and the calculation result is output as angle information. The output angle information is proportional to the movement amount (stroke) of the shaft 40, and therefore, it is possible to detect the movement amount of the shaft 40 eventually.

The output method from the detection body 72 may be any method and may be selected corresponding to an ECU (not shown) that uses the detection result of the detection body 72 and the like. Examples of the output method from the detection body 72 include an analog method, a pulse width modulation (PWM) method, and a single edge nibble transmission (SENT) method.

<Cover>

The cover 80 has a tube shape so as to close the gap between the second shaft member 42 of the shaft 40 and the second housing half body 55 of the housing 50. The cover 80 is formed of an elastic member such as rubber.

The cover 80 includes: an axial direction seal 81 that is in close contact with the flange surface 58 in the axial line direction; a radial direction seal 82 that is in close contact with the second shaft member 42 of the shaft 40 in the radial direction; a bending/stretching part 83 that is provided between the axial direction seal 81 and the radial direction seal 82 and that is capable of being bent and stretched when the shaft 40 is slid; and an internal pressure-adjusting part 84 that adjusts the pressure (internal pressure) in the cover 80.

Figure 6:
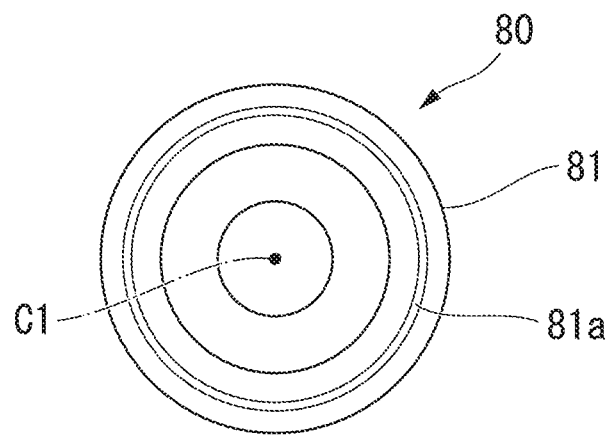
FIG. 6 is a plan view of an axial direction seal of a cover according to the embodiment.

An elastic protrusion part 81a that protrudes toward the flange surface 58 is provided on the axial direction seal 81. As shown in FIG. 6, the elastic protrusion part 81a has an annular shape so as to surround the slide end 55a (refer to FIG. 3) when seen from the axial line direction.

Figure 7:
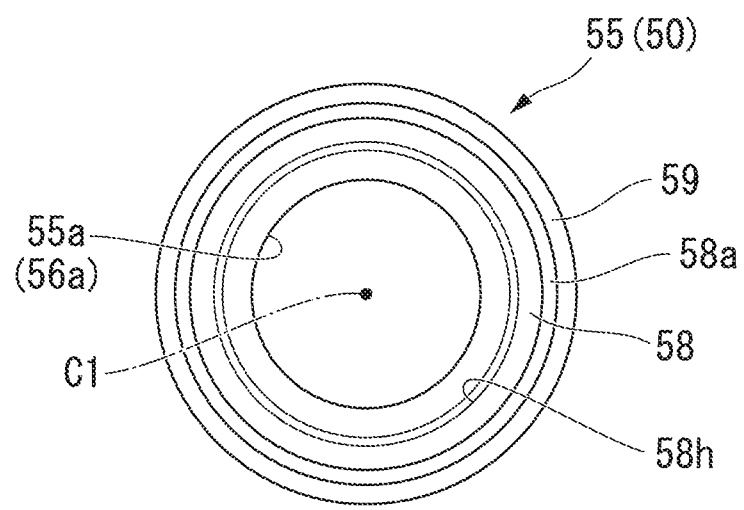
FIG. 7 is a plan view of a flange surface of a housing according to the embodiment.

On the other hand, a recess part 58h to which the elastic protrusion part 81a is fitted is provided on the flange surface 58. As shown in FIG. 7, the recess part 58h has an annular shape so as to surround the slide end 55a when seen from the axial line direction. That is, the recess part 58h has an outer shape that is overlapped with the elastic protrusion part 81a when seen from the axial line direction.

A step part 58a that has an annular shape when seen from the axial line direction and is higher by one step than the flange surface 58 is formed close to the outer circumference of the flange surface 58. Thereby, when attaching the cover 80, the cover 80 can be temporarily joined until the cover 80 is fixed by a fixation member 90.

As shown in FIG. 3, the radial direction seal 82 is arranged such that the inner circumferential surface of the radial direction seal 82 is in close contact with the outer circumferential surface of the second shaft member main body 42a and such that the lower end of the radial direction seal 82 is in close contact with the upper surface of the rib 43.

The bending/stretching part 83 includes one folding part 83a that is arranged at a position close to the housing 50.

In the cross-sectional view of FIG. 3, the internal pressure-adjusting part 84 extends from the inner end in the radial direction of the axial direction seal 81 such that a lower part is gradually positioned more inside in the radial direction, is then bent at the folding part 83a to extend such that a lower part is positioned further outside in the radial direction, and is then bent inside in the radial direction to extend to the upper end of the radial direction seal 82.

The internal pressure-adjusting part 84 adjusts the internal pressure by expanding or shrinking such that the volume (hereinafter, referred to as "air volume") of a space 85 between the cover 80 and the shaft 40 is not changed when the bending/stretching part 83 is bent or stretched in accordance with the sliding of the shaft 40.

Figure 8:
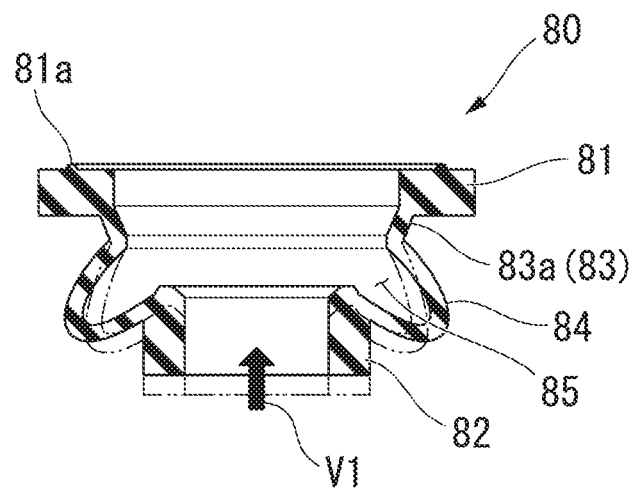
FIG. 8 is a view when a bending/stretching part of the cover according to the embodiment is bent.

For example, when the shaft 40 at the origin position is displaced so as to be pushed into the housing 50 (that is, so as to be pushed upward), as shown in FIG. 8, the bending/stretching part 83 is bent by the cover 80 being pushed in a direction represented by an arrow V1, and the internal pressure-adjusting part 84 expands such that the air volume is not changed. The two-dot chain line in FIG. 8 represents the contour of the cover 80 at the origin position.

Figure 9:
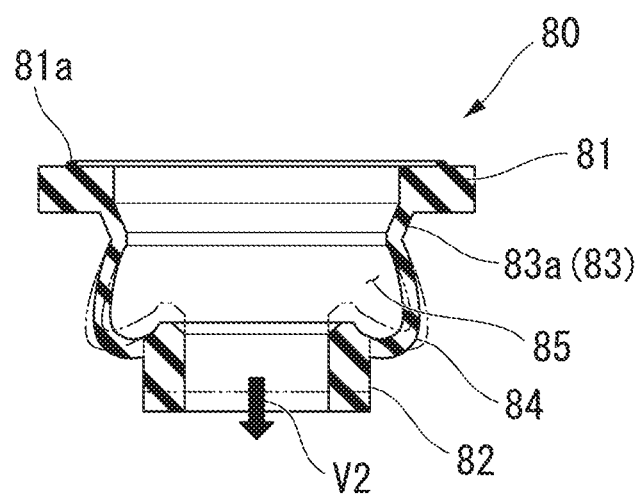
FIG. 9 is a view when the bending/stretching part of the cover according to the embodiment is stretched.

On the other hand, when the shaft 40 at the origin position is displaced so as to be drawn from the housing 50 (that is, so as to be drawn downward), as shown in FIG. 9, the bending/stretching part 83 is stretched by the cover 80 being drawn in a direction represented by an arrow V2, and the internal pressure-adjusting part 84 shrinks such that the air volume is not changed. The two-dot chain line in FIG. 9 represents the contour of the cover 80 at the origin position.

<Fixation Member>

As shown in FIG. 3, the stroke sensor 35 further includes the fixation member 90 that presses the axial direction seal 81 to be in contact with the flange surface 58. For example, the fixation member 90 is formed of a metal member. As shown in FIG. 5, the fixation member 90 has a bowl shape and includes: a circumferential wall 91 having a tube shape that is fitted to the protrusion wall 59; and a bottom wall 92 that has an annular shape, that continues to the circumferential wall 91, and that presses the axial direction seal 81 to be in contact with the flange surface 58.

<Assembly Method of Stroke Sensor>

Hereinafter, an example of an assembly method of the stroke sensor 35 is described.

Figure 10:
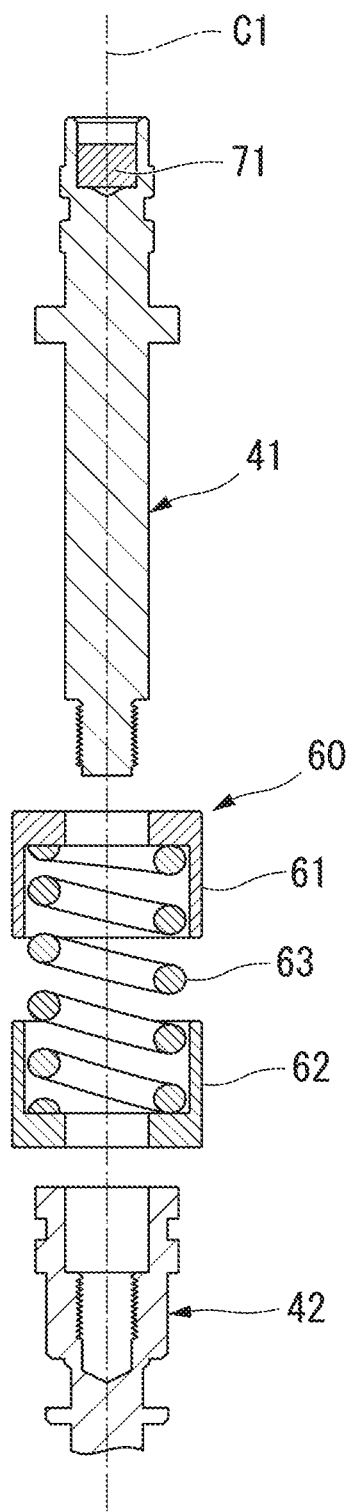
FIG. 10 is a view showing a shaft before attachment according to the embodiment.

As shown in FIG. 10, first, the first shaft member 41 to which the detected body 71 is fixed, the origin return means 60 in which the biasing member 63 is interposed between the first piston 61 and the second piston 62, and the second shaft member 42 are aligned in the axial line direction.

Figure 11:
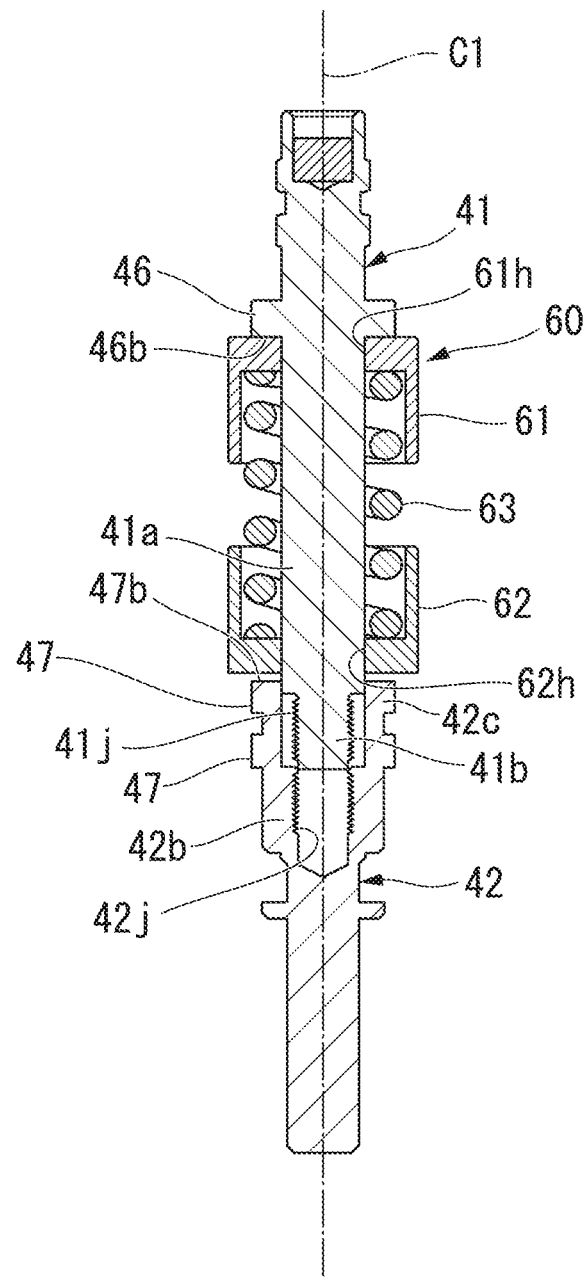
FIG. 11 is a view showing the shaft before attachment following FIG. 10.

As shown in FIG. 11, next, the first shaft member 41 is inserted through a shaft center opening (that is, the penetration hole 61h of the first piston 61 and the penetration hole 62h of the second piston 62) of the origin return means 60 from the connection part 41b. The lower end of the connection part 41b of the first shaft member 41 comes into contact with the opening end of the connected part 42b of the second shaft member 42, and thereby, the positions of the first shaft member 41 and the second shaft member 42 in the axial line direction are matched with each other. Accordingly, the screwing by the male screw part 41j of the connection part 41b and the female screw part 42j of the connected part 42b can be performed while maintaining the concentric state between the first shaft member 41 and the second shaft member 42.

Before the male screw part 41j of the connection part 41b is screwed to the female screw part 42j of the connected part 42b, the lower end part of the first shaft member main body 41a comes into contact with and is fitted to the inner circumferential surface on the opening end side of the guide part 42c of the second shaft member 42, and thereby, the first shaft member 41 becomes concentric with the second shaft member 42. Thereby, the screwing by the male screw part 41j of the connection part 41b and the female screw part 42j of the connected part 42b can be performed while maintaining the concentric state between the first shaft member 41 and the second shaft member 42 and while interposing the origin return means 60 by the end surface 46b of the extended diameter part 46 and the end surface 47b of the non-holding part-side slide part 47. Accordingly, even when there is a repulsion force (elastic force) by the biasing member 63, the screwing between the connection part 41b and the connected part 42b can be easily performed without axial displacement between the first shaft member 41 and the second shaft member 42.

Additionally, the non-holding part-side slide part 47 is provided on the outer circumferential surface of the guide part 42c of the second shaft member 42, and thereby, it is possible to pivotally support the first shaft member 41 and the second shaft member 42 at a position where the non-holding part-side slide part 47 is provided. Therefore, even when the shaft 40 has a divided structure, it is possible to maintain the axial accuracy of the shaft 40 with high accuracy. Further, the first shaft member 41 and the second shaft member 42 are pivotally supported at the position where the non-holding part-side slide part 47 is provided, and thereby, the pivot support parts of the first shaft member 41 and the second shaft member 42 are not easily deformed. Therefore, even when the shaft 40 has a divided structure, it is possible to maintain detection with high accuracy.

Figure 12:
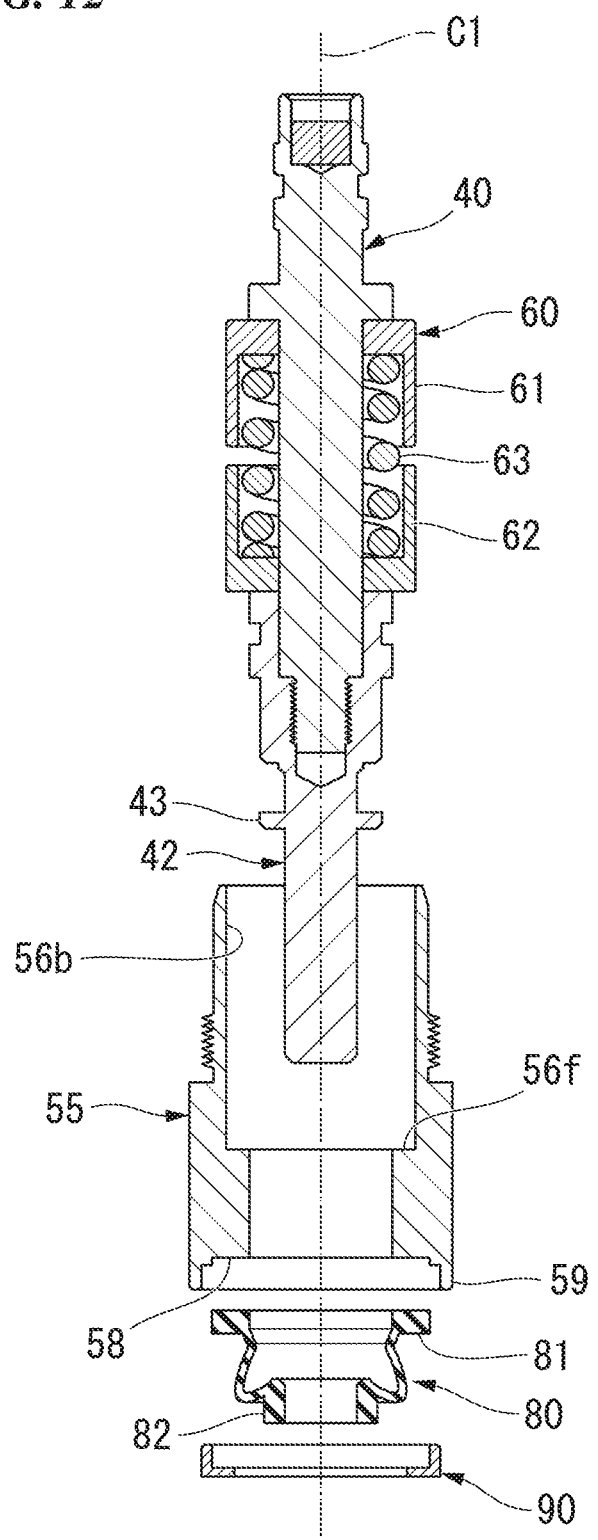
FIG. 12 is a view showing the housing before attachment according to the embodiment.

As shown in FIG. 12, the shaft 40 in which the origin return means 60 is provided is inserted through an opening (that is, the origin return means housing inner wall 56b) of the second housing half body 55 from the lower end of the second shaft member 42. As described above, the first piston 61 in the origin return means 60 is arranged so as to have a clearance between the outer circumferential wall 61b of the first piston 61 and the origin return means housing inner wall 56b of the second housing half body 55, and the second piston 62 in the origin return means 60 is arranged so as to have a clearance between the outer circumferential wall 62b of the second piston 62 and the origin return means housing inner wall 56b of the second housing half body 55 (refer to FIG. 3). Thereby, it is possible to improve the workability when attaching the shaft 40 to the second housing half body 55.

When the shaft 40 is just inserted through the second housing half body 55 (that is, when the second piston 62 comes into contact with the second piston regulation surface 56f, and the second shaft member 42 protrudes downward than the second housing half body 55), after the axial direction seal 81 of the cover 80 comes into close contact with the flange surface 58, the fixation member 90 is pressed into and is fitted to the protrusion wall 59, and thereby, the axial direction seal 81 is fitted to the lower end part of the second housing half body 55.

The rib 43 of the second shaft member 42 is inserted in the opening of the radial direction seal 82 of the cover 80, and the radial direction seal 82 of the cover 80 comes into close contact with the outer circumferential surface of the second shaft member 42 and the upper surface of the rib 43.

Figure 13:
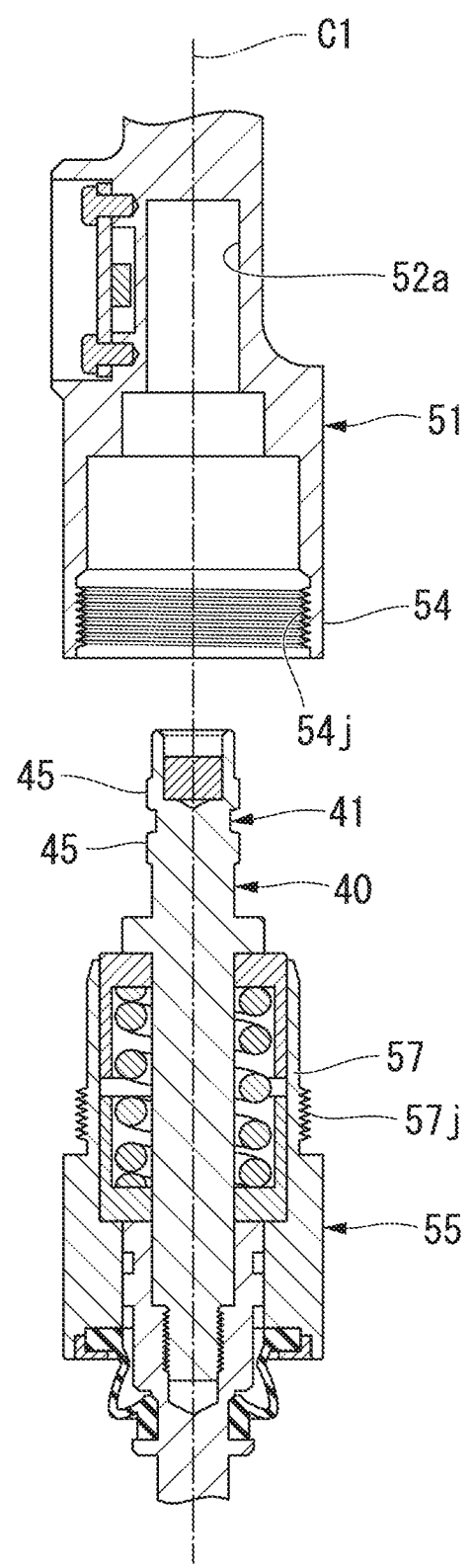
FIG. 13 is a view showing the housing before attachment following FIG. 12.

As shown in FIG. 13, the first housing half body 51 is connected to the second housing half body 55 that is attached to the shaft 40. Specifically, the second housing half body 55 that is attached to the shaft 40 is inserted into the first housing half body 51 from the upper end of the first shaft member 41, and screwing by the male screw part 57j of the connection part 57 and the female screw part 54j of the connected part 54 is performed.

At this time, the holding part-side slide part 45 that is provided on the upper end side of the first shaft member 41 comes into contact with and is fitted to the holding part-side inner wall 52a of the first housing half body 51, and thereby, the male screw part 57j of the connection part 57 can be screwed to the female screw part 54j of the connected part 54 without caring the attachment state at the fit position.

Accordingly, the stroke sensor 35 (refer to FIG. 3) according to the present embodiment is obtained.

The embodiment is not limited to connecting the first housing half body 51 to the second housing half body 55 that is attached to the shaft 40. The second housing half body 55 may be connected to the first housing half body 51 that is attached to the shaft 40. That is, even in this case, the holding part-side slide part 45 that is provided on the upper end side of the first shaft member 41 comes into contact with and is fitted to the holding part-side inner wall 52a of the first housing half body 51, and thereby, the male screw part 57j of the connection part 57 can be screwed to the female screw part 54j of the connected part 54 without caring the attachment state at the fit position.

As described above, the stroke sensor 35 according to the embodiment described above includes: the shaft 40 that extends in the axial line direction; the detected body 71 that is fixed to the shaft 40; the housing 50 that extends along the shaft 40, that houses the shaft 40, and that supports the shaft 40 slidably in the axial line direction; and the detection body 72 that detects the movement amount of the detected body 71 which moves in accordance with the sliding of the shaft 40, wherein the shaft 40 includes the plurality of shaft members 41, 42 that are connected to each other in the axial line direction and that are formed of metal, and the slide part 45, 47 that is in contact with the inner wall of the housing 50 and that slides so as to regulate the movement of the shaft 40 in the direction that is crossed with the axial line C1 is provided on each of the plurality of shaft members 41, 42.

According to the configuration, the shaft 40 includes the plurality of shaft members 41, 42 that are connected to each other in the axial line direction and that are formed of metal, and thereby, it is possible to enhance the size accuracy of the shaft 40 compared to a case in which the shaft member is formed of plastic. Further, the shaft members 41, 42 that are formed of metal are connected to each other, and therefore, it is possible to prevent accumulation of size errors associated with the increase of components and prevent axial displacement of the shaft 40. Further, even when the stroke sensor 35 is applied to a position where a great temperature change occurs, the shaft 40 is not thermally deformed. Further, the slide part 45, 47 that is in contact with the inner wall of the housing 50 and that slides so as to regulate the movement of the shaft 40 in the direction that is crossed with the axial line C1 is provided on each of the plurality of shaft members 41, 42. Thereby, it is possible to prevent the shaft 40 from moving in the direction that is crossed with the axial line C1 when the shaft 40 slides. Accordingly, it is possible to maintain high detection accuracy. Additionally, although it is necessary to integrally mold the shaft member and the detected body by outsert molding or insert molding when the shaft member is formed of plastic, it is unnecessary to integrally mold the shaft member and the detected body by outsert molding or insert molding according to the configuration. Therefore, it is possible to easily perform attachment between the shaft 40 and the detected body 71.

Further, in the embodiment described above, the shaft 40 includes the detected body-holding part 41c that houses and holds the detected body 71, and the plurality of the slide parts 45, 47 includes the holding part-side slide part 45 that is provided on the detected body-holding part 41c. Thereby, position displacement between the detected body 71 and the detection body 72 does not easily occur, and therefore, it is possible to further reliably maintain high detection accuracy.

Further, in the embodiment described above, the plurality of the slide parts 45, 47 further includes the non-holding part-side slide part 47 that is provided at a position which avoids the detected body-holding part 41c, and the outer shape of the holding part-side slide part 45 is smaller than the outer shape of the non-holding part-side slide part 47 when seen from the axis line direction. Thereby, it is possible to ensure a larger arrangement space of the detection body 72 compared to a case in which the outer shape of the holding part-side slide part 45 is larger than the outer shape of the non-holding part-side slide part 47 when seen from the axial line direction, and therefore, it is possible to prevent the size of the stroke sensor 35 on the detection body 72 side from being increased in the radial direction.

Further, in the embodiment described above, the groove part 48 that is recessed more inward in the radial direction than the inner wall of the housing 50 is provided on the shaft 40. Thereby, it is possible to reduce the contact area between the inner wall of the housing 50 and the shaft 40, and therefore, it is possible to reduce a slide resistance.

Further, in the embodiment described above, the lubricant is arranged on the groove part 48. Thereby, it is possible to stop the lubricant by using the groove part 48, and therefore, it is possible to maintain a lubricating property.

Further, in the embodiment described above, a portion of the outer circumferential surface of the slide part 47 forms a shape having the flat surface 47a, and the inner wall of the housing 50 has a shape that corresponds to the outer circumferential surface of the slide part 47. Thereby, it is possible to regulate the movement in the circumferential direction of the shaft 40 with respect to the inner wall of the housing 50, and therefore, it is possible to stop the rotation of the shaft 40 around the axial line C1.

Further, in the embodiment described above, the plurality of the slide parts 45, 47 includes the non-holding part-side slide part 47 (large slide part) having a relatively large outer shape when seen from the axial line direction, and the flat surface 47a is formed on the non-holding part-side slide part 47 (large slide part). Thereby, the flat surface 47a can be large. Therefore, it is possible to ensure the strength of the part that functions as a rotation stopper of the shaft 40 and further reliably stop the rotation of the shaft 40.

Further, in the embodiment described above, the housing 50 includes the first housing half body 51 and the second housing half body 55 that are divided in the axial line direction, the plurality of the slide parts 45, 47 includes the holding part-side slide part 45 (first slide part) that is in contact with the inner wall of the first housing half body 51 and the non-holding part-side slide part 47 (second slide part) that is in contact with the inner wall of the second housing half body 55, the inner wall of the first housing half body 51 and the inner wall of the second housing half body 55 have a shape that is different from each other when seen from the axial line direction, and the holding part-side slide part 45 and the non-holding part-side slide part 47 have a shape that is different from each other when seen from the axial line direction. Thereby, even when the combination between the first housing half body 51 and the shaft 40 and the combination between the second housing half body 55 and the shaft 40 are erroneous, the first housing half body 51 and the shaft 40 are not attached to each other, and the second housing half body 55 and the shaft 40 are not attached to each other. Therefore, it is possible to prevent erroneous attachment.

Further, in the embodiment described above, it is possible to maintain high detection accuracy in the motorcycle 1 that includes the above stroke sensor 35.

The above embodiment is described using an example in which a portion of the outer circumferential surface of the non-holding part-side slide part forms a shape having a flat surface, and the inner wall of the housing has a shape that corresponds to the outer circumferential surface of the non-holding part-side slide part; however, the embodiment is not limited thereto. For example, a portion of the outer circumferential surface of the holding part-side slide part may form a shape having a flat surface, and the inner wall of the housing may have a shape that corresponds to the outer circumferential surface of the holding part-side slide part.

Further, the above embodiment is described using an example in which the extended diameter part 46 is close to the inner wall of the housing 50 while keeping a slight gap without coming into contact with the inner wall of the housing 50 (without sliding); however, the embodiment is not limited thereto. For example, the extended diameter part 46 may be in contact with the inner wall of the housing 50 so as to slide. According to the configuration, the diameter part 46 in addition to the slide parts 45, 47 also slides, and the slide position is increased. Thereby, the position displacement between the detected body 71 and the detection body 72 does not easily occur, and therefore, it is possible to further reliably maintain further high detection accuracy.

The present invention is not limited to the above embodiment. For example, the shift speed change means is not limited to a shift pedal and may be a shift actuator (motor).

The saddle riding type vehicle of the present invention includes all vehicles on which a driver straddles a vehicle body. The saddle riding type vehicle includes not only a motorcycle (including a motorized bicycle and a scooter-type vehicle) but also a three-wheeled vehicle (including a vehicle having two front wheels and one rear wheel in addition to a vehicle having one front wheel and two rear wheels) or a four-wheeled vehicle.

The configuration in the above embodiment is an example of the invention, and various changes such as substitution of the configuration element of the embodiment by a known configuration element can be made without departing from the scope of the invention.

The invention claimed is:

1. A stroke sensor, comprising:
   a shaft that extends in a direction along an axial line;
   a detected body that is fixed to the shaft;
   a housing that extends along the shaft, that houses the shaft, and that supports the shaft slidably in the direction along the axial line; and
   a detection body that detects a movement amount of the detected body which moves in accordance with sliding of the shaft,
   wherein
   the shaft comprises a plurality of shaft members that are connected to each other in the direction along the axial line and that are formed of metal,
   a slide part that is in contact with an inner wall of the housing and that slides so as to regulate a movement of the shaft in a direction that is crossed with the axial line is provided on each of the plurality of shaft members, the housing comprises a first housing half body and a second housing half body that are connected to each other and that are coaxial with the axial line, a plurality of the slide parts comprises a first slide part that is in contact with an inner wall of the first housing half body and a second slide part that is in contact with an inner wall of the second housing half body, the inner wall of the first housing half body and the inner wall of the second housing half body have a shape that is different from each other when seen from the direction along the axial line, and the first slide part and the second slide part have a shape that is different from each other when seen from the direction along the axial line.

2. The stroke sensor according to claim 1, wherein the shaft comprises a detected body-holding part that houses and holds the detected body, and the plurality of the slide parts comprises a holding part-side slide part that is provided on the detected body-holding part.

3. The stroke sensor according to claim 2, wherein the plurality of the slide parts further comprises a non-holding part-side slide part that is provided at a position which avoids the detected body-holding part, and an outer shape of the holding part-side slide part is smaller than an outer shape of the non-holding part-side slide part when seen from the direction along the axial line.

4. The stroke sensor according to claim 1, wherein a groove part that is recessed more inward in a radial direction than the inner wall of the housing is provided on the shaft.

5. The stroke sensor according to claim 4, wherein a lubricant is arranged on the groove part.

6. The stroke sensor according to claim 1, wherein a portion of an outer circumferential surface of the slide part forms a shape having a flat surface, and the inner wall of the housing has a shape that corresponds to the outer circumferential surface of the slide part.

7. The stroke sensor according to claim 6, wherein the plurality of the slide parts comprises a large slide part having a relatively large outer shape when seen from the direction along the axial line, and the flat surface is formed on the large slide part.

8. A saddle riding type vehicle comprising a stroke sensor according to claim 1.

* * * * *